(12) United States Patent
McCullough

(10) Patent No.: US 6,292,255 B1
(45) Date of Patent: *Sep. 18, 2001

(54) DOSE CORRECTION FOR ALONG SCAN LINEWIDTH VARIATION

(75) Inventor: Andrew W. McCullough, Newtown, CT (US)

(73) Assignee: SVG Lithography Systems, Inc., Wilton, CT (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/232,756

(22) Filed: Jan. 15, 1999

Related U.S. Application Data

(63) Continuation-in-part of application No. 09/232,758, filed on Jan. 15, 1999, now Pat. No. 6,013,401, which is a continuation-in-part of application No. 09/023,407, filed on Feb. 12, 1998, now Pat. No. 5,895,737, which is a continuation-in-part of application No. 08/829,099, filed on Mar. 31, 1997, now Pat. No. 5,966,202.

(51) Int. Cl.$^7$ ............................ G03B 27/54; G03B 27/42; G03B 27/32; G03C 5/00
(52) U.S. Cl. .............................. 355/67; 355/53; 355/77; 430/30
(58) Field of Search ............................. 355/67, 53, 77; 430/4, 30

(56) References Cited

U.S. PATENT DOCUMENTS

| | | | |
|---|---|---|---|
| 5,656,182 | * | 8/1997 | Marchman et al. ............... 430/4 |
| 5,896,188 | * | 4/1999 | McCullough ..................... 355/67 |
| 6,013,401 | * | 1/2000 | McCullough et al. ............ 430/30 |

* cited by examiner

Primary Examiner—Russell Adams
Assistant Examiner—Peter B. Kim
(74) Attorney, Agent, or Firm—Fattibene & Fattibene; Paul A. Fattibene; Arthur T. Fattibene

(57) ABSTRACT

In a scanning photolithographic device used in the manufacture of semiconductors, a method and apparatus for varying the exposure dose as a function of distance in the scan direction compensating for the signature of the photolithographic device for reducing linewidth variation in the scan direction. The linewidth in the scan direction may vary for a particular device or tool for a variety of reasons. This variation or signature is used in combination with a photosensitive resist response function to vary the exposure dose as a function of distance in a scan direction, substantially reducing the linewidth variation. A dose control varies the exposure dose as a function of distance in a scan direction to correct linewidth variations caused by characteristics of the photolithographic system. Linewidth variations as a function of distance in the direction of scan are substantially reduced, resulting in more consistent and improved feature or element sizes.

15 Claims, 5 Drawing Sheets

DOSE CORRECTION FOR ALONG SCAN LINEWIDTH VARIATION

RELATED APPLICATIONS

This application is a continuation-in-part of application Ser. No. 09/232,758 filed Jan. 15, 1999 now U.S. Pat. No. 6,013,401 which is a continuation-in-part of application Ser. No. 09/023,407 filed Feb. 12, 1998 now U.S. Pat. No. 5,895,737 which is a continuation-in-part of application Ser. No. 08/829,099 filed Mar. 31, 1997 which is now U.S. Pat. No. 5,966,202.

FIELD OF THE INVENTION

The present invention relates generally to photolithography as used in the manufacture of semiconductor devices, and particularly to correction of exposure in a scanning direction of a scanning photolithographic system to control or reduce linewidth variation.

BACKGROUND OF THE INVENTION

In the manufacture of semiconductor devices, photolithographic techniques are often used. Generally, this involves projecting the image of a reticle onto a photosensitive resist covered wafer and subsequent processing to create a semiconductor device. While there are many different types of photolithographic systems used in the manufacture of semiconductor devices, one type of device or tool providing imaging of very small linewidths or featured sizes is a scanning photolithographic system. One such system is sold under the trademark MICRASCAN by SVG Lithography Systems, Inc., Wilton, Conn. In a scanning photolithographic system, a rectangular shaped illumination field or slit is scanned at a predetermined rate across a reticle being imaged onto a photosensitive substrate, such as a photosensitive resist or photoresist covered wafer. The reticle and photosensitive substrate move synchronously with each other at different rates to accommodate any magnification or reduction of the image of the reticle by the projection optics used to project the image of the reticle onto the photosensitive substrate. As the feature sizes or linewidths of the various elements or circuit patterns being reproduced onto the photosensitive substrate decrease in size, there is a need to increase system performance. While projection optics have advanced considerably and are a major influence on image quality, the illumination used to project the image of the reticle onto the photosensitive substrate is also critical to system performance and quality of the finished semiconductor device. While there have been many attempts to provide more improved illumination with various illumination sources, most of these efforts have been directed to providing a uniform illumination. A device for modifying illumination used in a photolithographic device is disclosed in U.S. Pat. No. 4,516,852 entitled "Method and Apparatus for Measuring Intensity Variations in a Light Source", issuing to Liu et al on May 14, 1985, which is herein incorporated by reference. Therein disclosed is an arcuate slit that is adjustable with a deformable band. Another system for improving illumination used in a scanning photolithographic system is disclosed in U.S. patent application Ser. No. 09/023,407 filed Feb. 12, 1998 and entitled "Adjustable Slit and Method for Varying Linewidth", which is herein incorporated by reference. While these prior devices are useful in adjusting the illumination properties of the illumination slit used to scan a reticle, they have generally only been beneficial in improving image quality along a single axes perpendicular to the direction of scan. Therefore, there is a need to further improve system performance and image quality in a direction along the direction of scan.

SUMMARY OF THE INVENTION

The present invention is directed to an apparatus and method for reducing linewidth variation in the direction of a scanning rectangular slit illumination field of an image reproduced from a reticle. Variations in linewidth produced along the axes or direction of scan whatever their cause may be is compensated for by adjusting the dose or exposure by a predetermined amount as a function of distance in the scanning direction, thereby obtaining a controlled or reduced linewidth variation along the scan direction. Variations of a particular photolithographic device or tool in combination with a known response function of a photosensitive resist or photoresist to dose is utilized in controlling the illumination to obtain the required corrected dose resulting in a reduced linewidth variation in the scan direction. A scanning photolithographic system having an illumination source projecting the image of a reticle onto a photosensitive substrate with projection optics has an illumination control that modifies the exposure dose of electromagnetic radiation by a predetermined amount as a function of distance in the scan direction. This compensates for known or determined variations in linewidth due to the signature of a particular scanning photolithographic system or tool resulting in reduced linewidth variation in the scan direction, therefore improving overall system performance.

Accordingly, it is an object of the present invention to control or reduce linewidth variation along a scan direction in a scanning photolithographic system.

It is an advantage of the present invention that linewidth variation may be controlled or reduced independent of the underlying cause of the original linewidth variations.

It is a further advantage of the present invention that it may be easily adapted to a particular scanning photolithographic system or tool having a unique signature.

It is yet another advantage of the present invention that the correcting dose or exposure is easily controlled, adjusted and changed as underlying system performance may vary over time.

It is a feature of the present invention that the exposure or dose is varied as a function of distance along a direction of scan.

It is another feature of the present invention that the determined linewidth change as a function of dose for a particular photoresist is utilized to adjust dose in the scan direction.

These and other objects, advantages, and features will be readily apparent in view of the following detailed description.

DETAILED DESCRIPTION OF THE PREFERRED EMBODIMENTS

Figure 1:
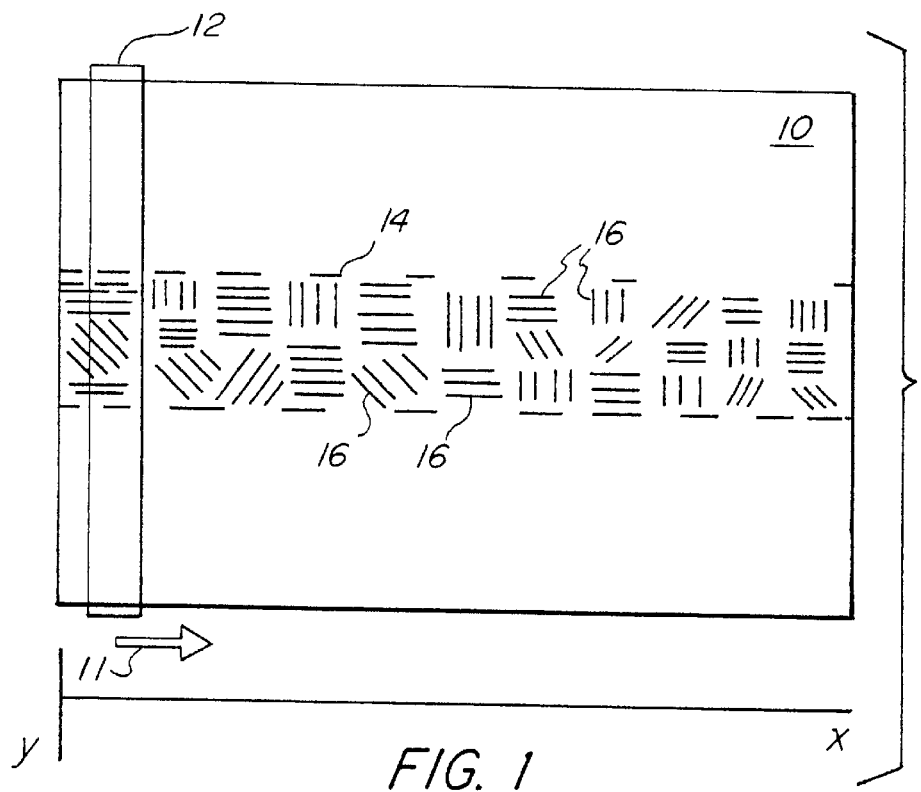
FIG. 1 is a schematic plan view of an exposed rectangular field.

FIG. 1 illustrates a field 10, which may be rectangular, which is exposed by an elongated rectangular scanning illumination slit or field 12. The illumination slit field 12 scans in a direction indicated by arrow 11 to sequentially expose a photosensitive substrate with the image of a reticle. The illumination slit field 12 scans along a single axes in the X direction. The illumination slit field 12 may also be stepped or moved to another location and scanned in a direction opposite to that indicated by arrow 11 to expose another rectangular field. Accordingly, through a series of step and scanning exposures a relatively large photosensitive substrate may be exposed. A central strip 14 is illustrated having a plurality of lines 16 thereon that have various linewidths and orientations. The plurality of lines 16 are schematically illustrative of circuit patterns or elements to be imaged on a photosensitive substrate placed in the exposed field 10. Generally, the entire exposed field 10 contains a plurality of lines used in forming the different circuits, however only the central strip 14 has been illustrated. A scanning photolithographic tool or system is used to project the image of a reticle with the scanning illumination slit field 12 onto a photosensitive substrate which is exposed with the image of the reticle. It has been discovered that for a variety of reasons, a particular tool or system may result in variations of linewidths as a function of distance in the X direction. Such a variation in performance is referred to as a signature. The signature may result from any cause, and may vary slightly over time.

Figure 2:
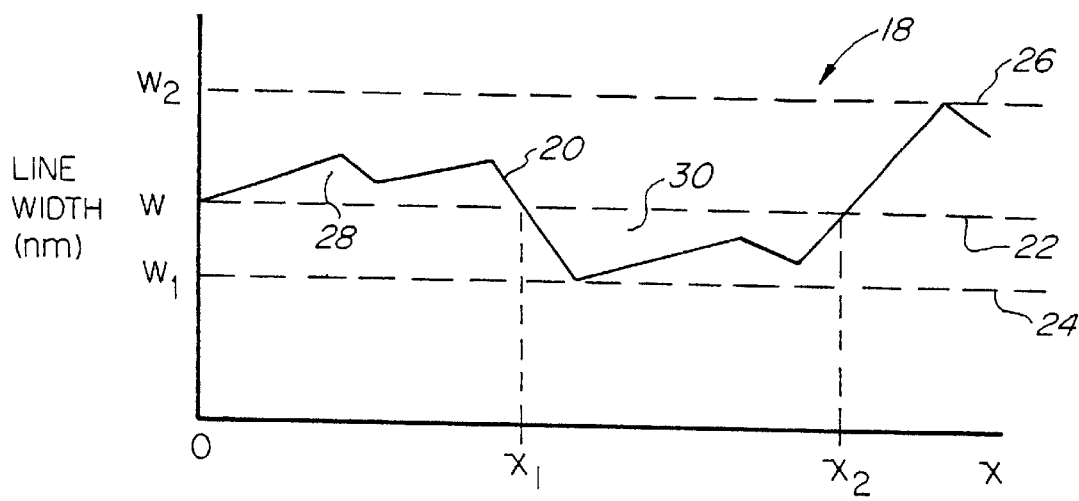
FIG. 2 is a graph illustrating linewidth as a function of distance in a scan direction for a particular photolithographic system or tool.

FIG. 2 illustrates the variation in linewidth or signature for a particular representative scanning photolithographic tool or system. It may be possible to correct the illumination along the longitudinal length of the scanning illumination slit field 12 to obtain reduced linewidth variation as a function of distance perpendicular to a scanning direction. However, even after any such corrections or modifications to the illumination slit field, linewidth variations will often result in the direction of the scanning illumination slit field. This variation in the direction of scan is illustrated in FIG. 2. Wave form 20 illustrates the linewidth variation as a function of distance in the direction of scan or X direction. This variation may be derived from any source, such as particularities of the illumination field, the projection optics, or scan anomalies among others. The particular variation or signature of the photolithographic system or tool can easily be determined by utilizing various test reticles and performing field measurements of linewidth variation printed on the wafer as a function of distance in the scan direction. Accordingly, this information may be determined for any particular photolithographic system or tool and may be referred to as indicated above as a tool signature. In a perfect photolithographic system, the waveform 20 would be a straight horizontal line in which the reproduced linewidth is the same as the desired linewidth along the entire scanning distance. However, for a variety of reasons, the linewidth may vary in a range between a decreased linewidth $W_1$, represented by dashed line 24 to an increased linewidth $W_2$, represented by dashed line 26, with the increased or decreased linewidth deviating from a desired nominal linewidth W, represented by dashed line 22, which may be for example 200 nanometers. Accordingly, the signature of a particular tool illustrated by wave form 20 may have an area 28 where the linewidth is greater than the nominal linewidth W for a distance along the scan direction until $x_1$, and an area 30 where the linewidth is less than a desired nominal width for another distance to $x_2$ in the direction of scan. As a result, it can clearly be seen that the resulting linewidth varies as a function of distance in the scan direction.

Figure 3:
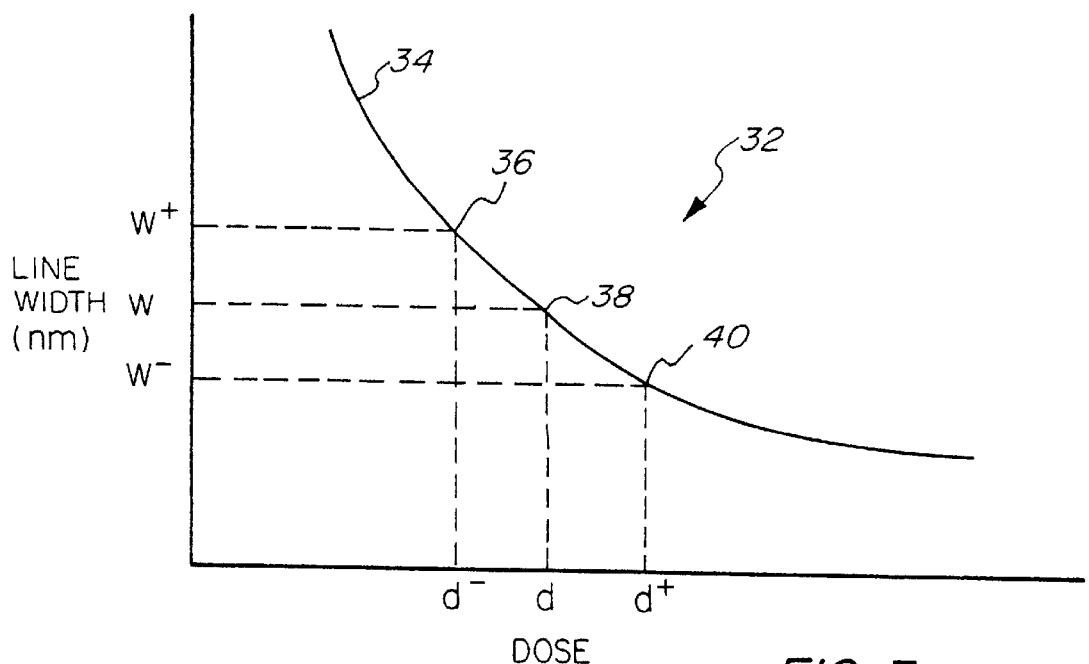
FIG. 3 is a graph illustrating linewidth as a function of dose or exposure for a particular positive photoresist.

FIG. 3 is a graph illustrating a photosensitive resist or photoresist exposure, transfer, or response function 32 for a positive photoresist. For a positive photoresist, increasing the exposure or dose will result in a decrease in linewidth [opaque line on reticle] of the resulting processed photoresist covered substrate, and decreasing the exposure or dose will result in an increased linewidth in the resulting processed photoresist covered substrate. Wave form 34 illustrates this relationship. A negative resist will have the opposite effect. That is, increasing the exposure or dose will result in an increase in linewidth of the resulting processed photoresist covered substrate, and decreasing the exposure or dose will result in a decreased linewidth in the resulting processed photoresist covered substrate. A nominal center point 38 illustrates a dose d that will result in a width W for a particular photoresist. Point 36 represents a reduced dose $d^-$ resulting in an increased linewidth $W^+$. Point 40 represents an increased dose $d^+$ resulting in a reduced or decreased linewidth $W^-$. Accordingly, even though a predetermined linewidth W on a reticle is imaged onto a photosensitive substrate, the resulting processed linewidth may vary as a function of dose or exposure. As a result, based on the photolithographic tool signature, as illustrated in FIG. 2, and the resist response function illustrated in FIG. 3, a corrected exposure dose can be determined to substantially reduce linewidth variation as a function of distance in a scanning direction.

Figure 4:
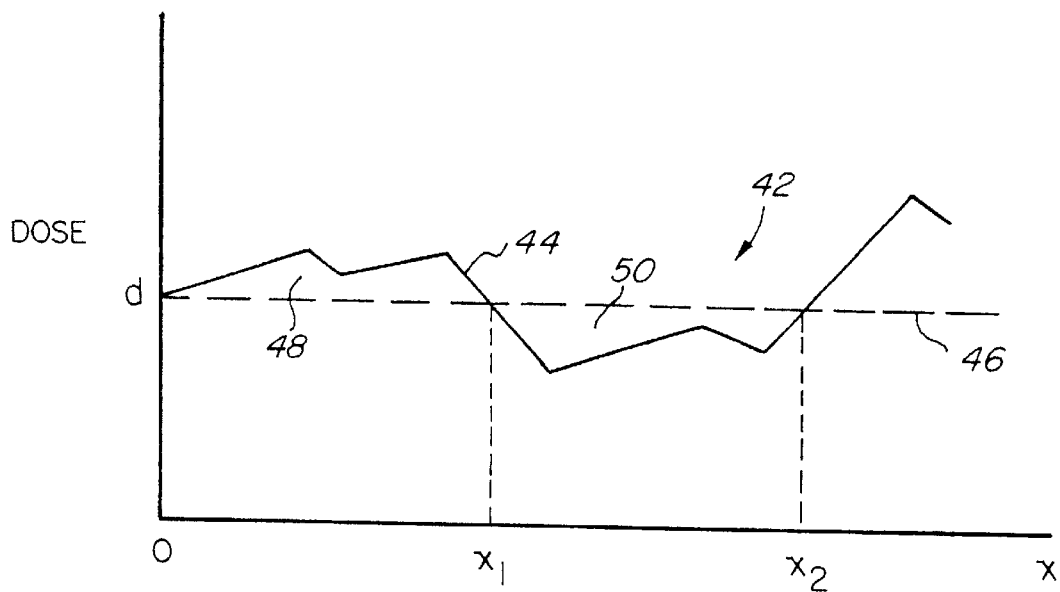
FIG. 4 is a graph illustrating a calculated corrected exposure or dose as a function of distance in the scan direction.

FIG. 4 is a graph illustrating a dose or exposure correction 42 which may be utilized to compensate for the signature 18, illustrated in FIG. 2, for a particular scanning photolithographic system or tool. A corrected or calculated dose 42 is represented by wave form 44. Horizontal line 46 represents a nominal dose d. Area 48 represents an increased exposure or dose, corresponding to an increased linewidth in area 28 illustrated in FIG. 2. The increased dose or exposure represented by area 48, for a positive resist as indicated in FIG. 3, will result in a narrower or smaller processed linewidth. Therefore, the increased dose represented by area 48 will correct for the undesired increased linewidth represented by area 28, illustrated in FIG. 2. As a result, linewidth variation is reduced with the linewidth over the entire x or scan direction approaching the desired linewidth W, illustrated in FIG. 2. The increased dose represented by area 48 is calculated or determined with the use of the resist response function 32, illustrated in FIG. 3. Area 50, between position $x_1$ and $x_2$, represents a decreased dose corresponding to area 30 in FIG. 2. The decreased dose represented by area 50, in FIG. 4, results in a widening of or an increase in the linewidth, for a positive resist as indicated in FIG. 3. This illumination dose or exposure correction is produced by a time variance in the exposure level appropriate to where the wafer/reticle are in their scan range. This can be done by use of a plurality of filters, shutters, or varying the number of laser pulses, or any other equivalent technique used to vary illumination exposure or dose. It can also be done by varying the scan speed. Based on the information obtained from the signature 18, illustrated in FIG. 2, and the resist response function 32, illustrated in FIG. 3, a modified or corrected dose or exposure as a function of distance in a scan direction can easily and readily be determined.

Figure 5:
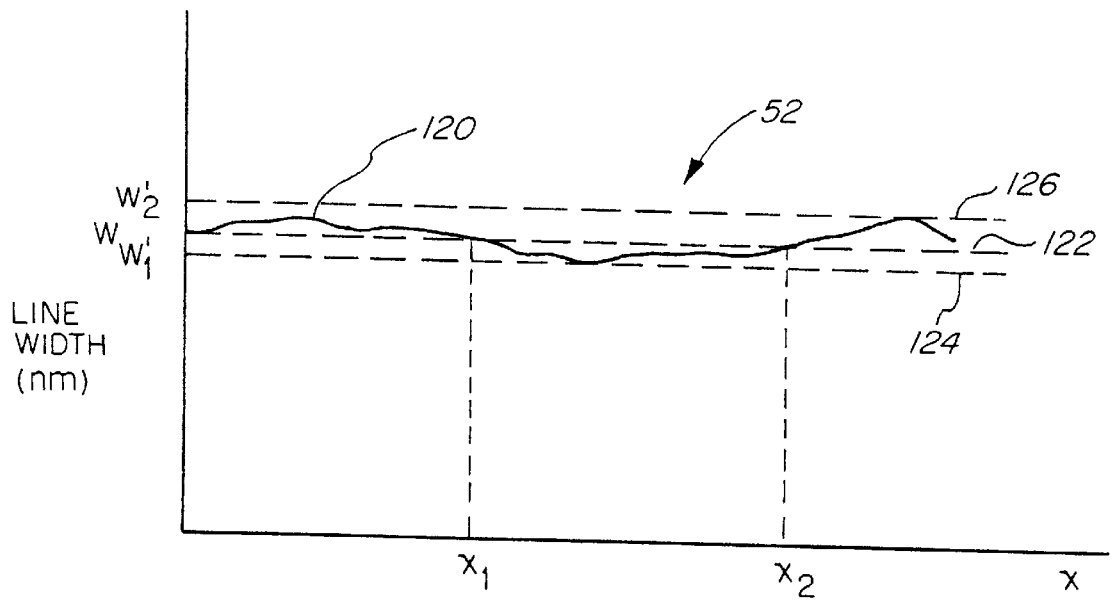
FIG. 5 is a graph illustrating the reduced linewidth variation as a function of distance in the scan direction.

FIG. 5 is a graph illustrating the reduced variation of linewidth 52 that results due to the present invention. Waveform 120 represents the linewidth as a function of distance in a scanning direction. As can clearly be seen, linewidth variance in a scanning direction is substantially reduced and varies from a nominal width W only slightly. The nominal width W is represented by horizontal line 122. The increased width $W_2'$ is represented by horizontal line 126 and the decreased width $W_1'$ is represented by horizontal line 124.

Figure 6A:
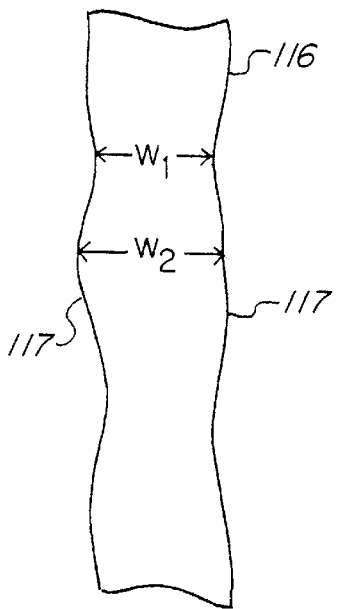
FIG. 6A is a schematic plan view of a portion of a linewidth illustrating linewidth variation.
Figure 6B:
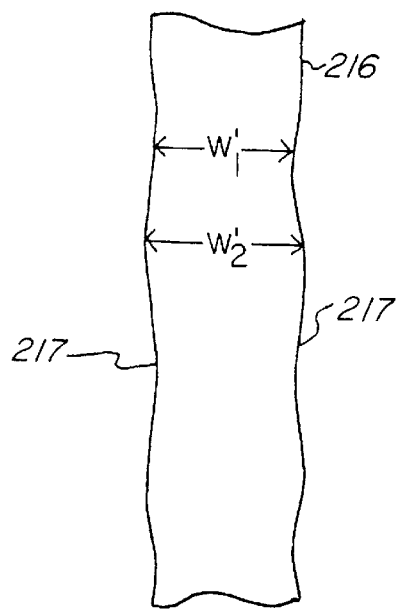
FIG. 6B is a schematic plan view of a portion of a linewidth illustrating reduced linewidth variation.

FIG. 6A is a plan view illustrating a portion of a linewidth 116 and the variation in width between edges 117. In FIG. 6A the linewidth varies from a narrower linewidth $W_1$ to a wider linewidth $W_2$. FIG. 6B is a plan view illustrating a portion of a linewidth 217 and the reduced variation in width between edges 217 that results from controlling the exposure or dose according to the present invention. In FIG. 6B the linewidth varies from a slightly narrower linewidth $W_1'$ to a slightly wider linewidth $W_2'$. As will be appreciated from FIGS. 6A and 6B linewidth variation is reduced enhancing system performance when practicing the present invention.

Figure 7:
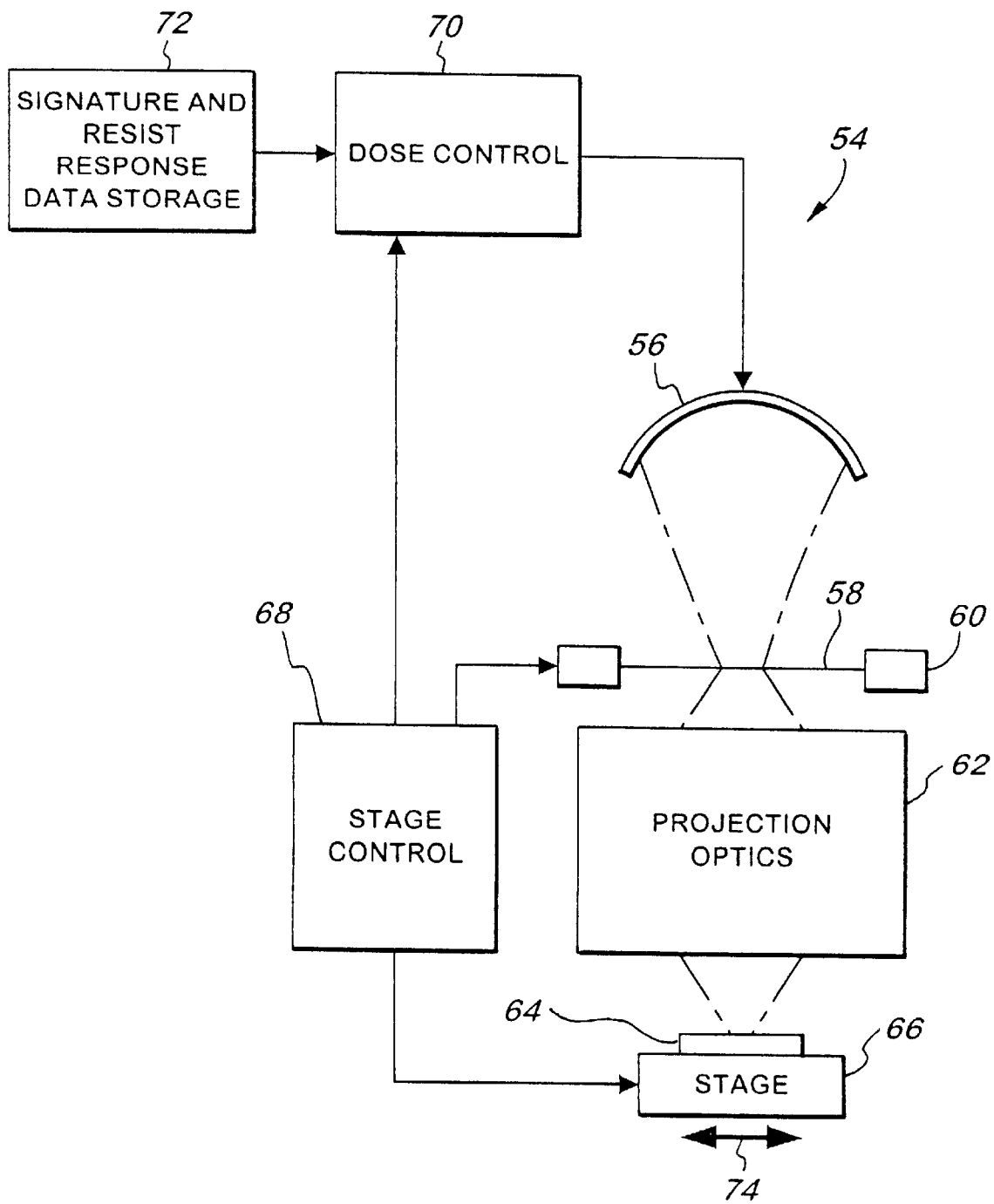
FIG. 7 schematically illustrates a scanning photolithographic apparatus, system, or tool of the present invention that substantially reduces variation in linewidth as a function of distance in the scan direction.

FIG. 7 schematically illustrates a scanning photolithographic system or tool 54 of the present invention. An illumination source 56 is used to project the image of a reticle 58 held by a reticle stage 60 with projection optics 62. The image of the reticle 58 is projected onto a photosensitive substrate 64, such as a photoresist covered wafer. Photosensitive substrate 64 is positioned on a stage 66. The movement of stage 66 and the reticle stage 60 is controlled by a stage control 68. The stage control 68 synchronously scans the reticle stage 60 and the stage 66 in the direction of arrow 74. An illumination slit field, as illustrated in FIG. 1, is scanned across the entire reticle 58 projecting the image of the entire reticle onto the photosensitive substrate 64. As a result of the high quality projection optics the image of the reticle is reproduced with high resolution. If the projection optics 64 have a magnification or reduction, the scanning rate of the reticle stage 60 and the stage 66 are modified appropriately by stage control 68. For example, if the image of the reticle is reduced by a factor of four, the reticle stage 60 will scan at a rate four times faster than the stage 66. Additionally, multiple sequential or adjacent images may be reproduced on the photosensitive substrate 64 with a step and scan type motion. Illumination or dose control 70 is associated with or coupled to the stage control 68, signature and resist response data storage 72, and the illumination source 56. The signature and resist response data storage 72 may be a magnetic disk drive, ROM, or any other storage medium for storing and retrieving data. The signature and resist response data storage 72 stores data representative of the signature of the photolithographic tool, as illustrated in FIG. 2, and the data representative of the resist response, as illustrated in FIG. 3. The dose control 70 may be any general purpose computing device associated with a control system that can calculate a corrected exposure dose based upon the signature and resist response data retrieved from the signature and resist response data storage 72. The dose control 70 regulates or controls the exposure dose as a function of distance along the scan direction represented by arrow 74. The dose control 70, therefore, adjusts the dose of electromagnetic radiation received by the photosensitive substrate 64 based upon information stored in the signature and resist response data storage 72. The calculated compensating exposure dose results in a modification of the resulting linewidth as a function of distance or position in the scan direction. This results in a reduced variation of linewidth in the scan direction. The dose control 70 may modify the illumination source directly by varying the amplitude or intensity, or in a pulsed illumination source by varying the number or rate of pulses so as to obtain the required predetermined exposure dose. The illumination source may be a laser or any other known illumination source. The dose control 70 may also control any other structure, technique, or method for varying the illumination or dose received by the photosensitive substrate 64, such as by the use of filters, apertures, shutters, the introduction of additional lens elements, or any other equivalent or known way to modify exposure dose.

Figure 8:
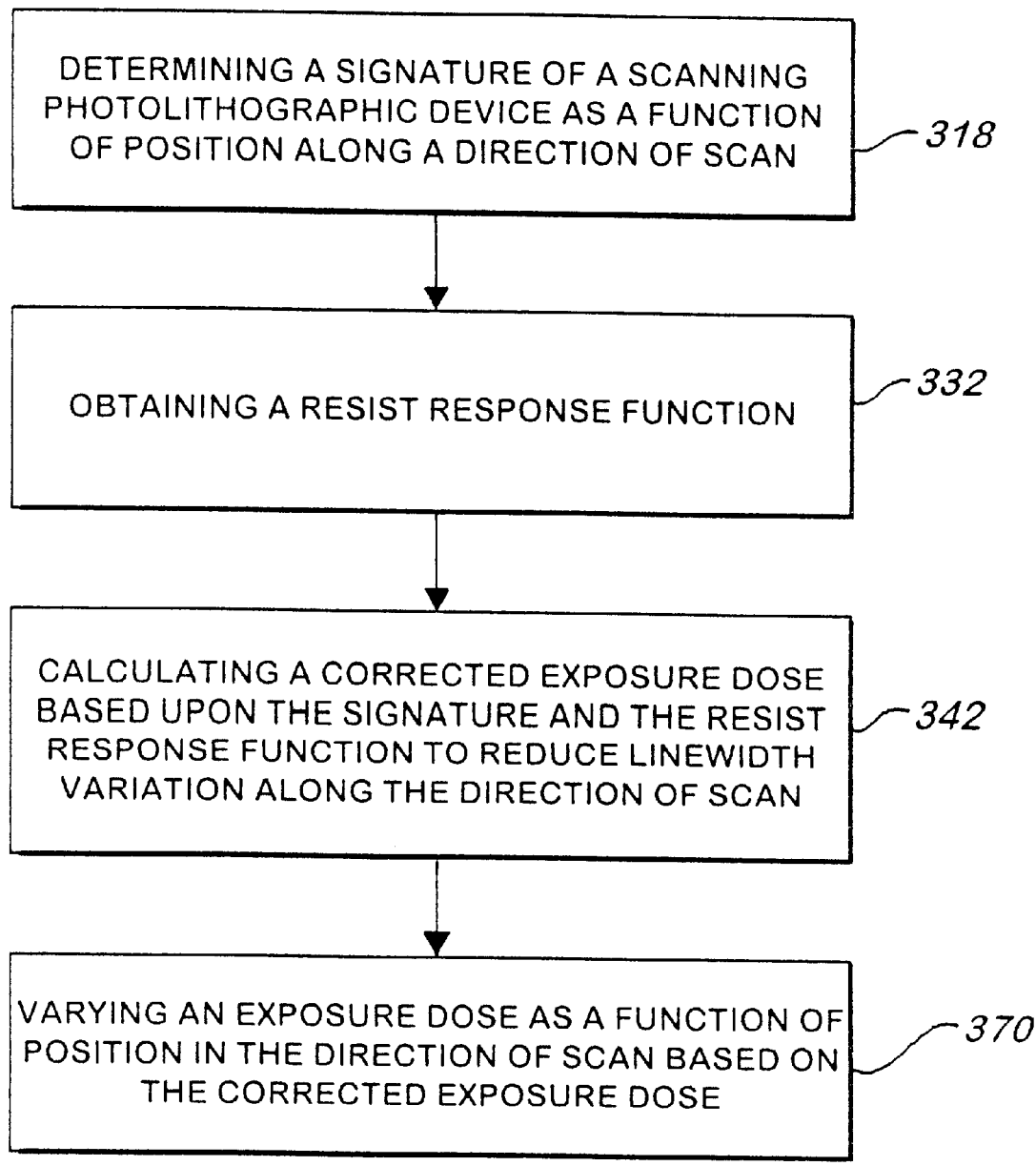
FIG. 8 is a block diagram illustrating the present invention.

FIG. 8 is a block diagram illustrating the present invention. Block 318 represents the act or step of determining a signature of a scanning photolithographic device as a function of position along a direction of scan. An example of a signature is illustrated graphically in FIG. 2 as signature 18. Block 332 represents the act or step of obtaining a resist response function. An example of a resist response function is graphically illustrated in FIG. 3 as resist response function 32. Block 342 represents the act or step of calculating a corrected exposure dose based upon the signature and the resist response function to reduce linewidth variation along the direction of scan. An example of the results of this calculation is graphically illustrated in FIG. 4 as dose correction 42. The required calculations may be performed by any means, such as a computer. The dose correction calculations are easily performed with reference to the signature 18, illustrated in FIG. 2, and resist response function 32, illustrated in FIG. 3. A corrected exposure dose is calculated by increasing or decreasing the exposure dose by an amount determined by the resist response function to correct for variations in linewidth as determined by the signature. Accordingly, linewidth variations are substantially reduced in the direction of scan. Block 370 represents the act or step of varying an exposure dose as a function of position in the direction of scan based on the corrected exposure dose. Varying an exposure dose may be easily performed with any dose control means, such as dose control 70 illustrated in FIG. 7.

The present invention greatly reduces linewidth variation over an exposure field in the direction of scan in a scanning photolithographic device. A position dependent exposure difference is used in a dose control feedback system to compensate for linewidth error from nominal or desired linewidth. The corrected or modified exposure or dose is determined or calculated from the known or determined change in linewidth as a function of exposure for a particular resist. A corrected exposure dose is easily determined from a direct measurement of the linewidth as a function of scan position and knowledge of the response function of linewidth as a function of exposure or dose. This correction or error function, inverted as necessary, is used by the dose control system or illumination control compensating for linewidth variations due to a particular tool's signature or from whatever cause. The net result is a reduced or smaller variation of linewidth along a scanning direction. The present invention is therefore particularly adapted to scanners and is an advantage for scanning photolithographic systems. The determined corrections or modifications in exposure dose are independent of the underlying cause of the linewidth variations which are to be corrected. Linewidth variations, however, need to be time stable for the period between recalibration. The linewidth variation correction of the present invention is a cylindrical, or one axis correction and does not impact any corrections longitudinally along the illumination slit or slot in a direction perpendicular to the scanning direction, which may be corrected simultaneously by other techniques. The corrections indicated in the present invention may be utilized in the scan direction whether proceeding from left to right or right to left. The present invention is better than instantaneously velocity modulating the scan, which is much more complicated. Accordingly, the present invention greatly enhances system performance and reduces linewidth variation in a direction of scan in a scanning photolithographic system. As a result, improved system performance is obtained and increased yield achieved in the manufacture of semiconductor devices.

Additionally, although the preferred embodiments have been illustrated and described, it will be obvious to those skilled in the art that various modifications may be made without departing from the spirit and scope of this invention.

What is claimed is:

1. A scanning photolithographic device having a corrected exposure dose comprising:

an illumination source providing electromagnetic radiation;

a reticle stage, positioned to receive the electromagnetic radiation from said illumination source;

projection optics positioned to receive the electromagnetic radiation from a reticle placed on said reticle stage;

a substrate stage positioned to receive the electromagnetic radiation from said projection optics;

a stage control coupled to said reticle stage and said substrate stage, said stage control controlling the movement of said reticle and substrate stages providing a scanning exposure of a photosensitive resist covered substrate and having a direction of scan; and a dose control, said dose control modifying an exposure dose resulting in a predetermined exposure dose of electromagnetic radiation being received by the photosensitive substrate as a function of position along the direction of scan, whereby variations in linewidth in the direction of scan are reduced.

2. A scanning photolithographic device as in claim 1 wherein:

the predetermined exposure dose is obtained by reference to a signature of the photolithgraphic device and a resist response function of the photosensitive resist.

3. A scanning photolithographic device as in claim 1 wherein:

said dose control comprises a calculator, said calculator calculating the predetermined exposure dose based upon a signature of the photolithographic device and a resist response function of the photosensitive resist.

4. A scanning photolithographic device as in claim 1 wherein:

said illumination source is a laser.

5. A scanning photolithographic device as in claim 1 wherein:

the substrate is a semiconductor wafer.

6. A scanning photolithographic system providing a corrected exposure dose for use in reducing linewidth variation in a direction of scan comprising:

an illumination source providing an illumination slit field of electromagnetic radiation;

a reticle stage holding a reticle with a pattern thereon, the pattern having linewidths, the reticle positioned by said reticle stage to receive the electromagnetic radiation from said illumination source and having the illumination slit field scanned across the reticle in the direction of scan;

projection optics positioned to receive the electromagnetic radiation from said reticle;

a substrate stage having a substrate with a photosensitive resist thereon positioned to receive the electromagnetic radiation from said projection optics;

a stage control coupled to said reticle stage and said substrate stage, said stage control controlling the movement of said reticle and substrate stages providing a scanning exposure of the photosensitive resist;

a signature and photosensitive resist response data storage medium; and a dose control associated with said illumination source and said signature and photosensitive resist response data storage medium, said dose control modifying an exposure dose as a function of position along the direction of scan based upon data from said signature and photosensitive resist response data storage medium resulting in a predetermined exposure dose of electromagnetic radiation being received by the photosensitive resist covered substrate, whereby variations in the linewidths in the scanning direction are reduced.

7. A scanning photolithographic system as in claim 6 wherein:

said dose control modifies the amplitude of said illumination source.

8. A scanning photolithographic system as in claim 6 wherein:

said illumination source comprises a laser.

9. A scanning photolithographic system as in claim 8 wherein:

said laser comprises a pulsed laser; and said dose control modifies the exposure dose by varying the number of pulses from the pulsed laser.

10. A device for reducing linewidth variation for use in a scanning photolithographic system comprising:

a storage device, said storage device storing signature and resist response data; and a dose control, associated with said storage means, said dose control calculating a corrected exposure dose based on the signature and resist response data and controlling an illumination source to provide the corrected exposure dose at a location in a scanning direction to a photosensitive substrate during a scanning exposure, whereby linewidth variation is reduced in a scan direction.

11. A device for reducing linewidth variation for use in a scanning photolithographic system comprising:

storage means for storing signature and resist response data; and dose control means, associated with said storage means, for calculating a corrected exposure dose based on the signature and resist response data and controlling an illumination source to provide the corrected exposure dose at a location in a scanning direction to a photosensitive substrate during a scanning exposure, whereby linewidth variation is reduced in a scan direction.

12. A method of exposing a photosensitive substrate to obtain reduced linewidth variation comprising:

determining a signature of a scanning photolithographic device as a function of position along a direction of scan;

obtaining a resist response function; and varying an exposure dose as a function of position in the direction of scan in relation to the signature and the resist response function to obtain a predetermined modified linewidth, whereby the exposure dose results in reduced linewidth variation.

13. A method of exposing a photosensitive substrate comprising:

determining a signature of a scanning photolithographic device as a function of position along a direction of scan;

obtaining a resist response function;

calculating a corrected exposure dose based upon the signature and the resist response function to reduce linewidth variation along the direction of scan; and varying an exposure dose as a function of position in the direction of scan based on the corrected exposure dose, whereby linewidth variation in the scan direction is reduced.

14. A method of exposing a photosensitive substrate used in a scanning photolithographic system for the manufacture of semiconductors comprising:

determining a signature of a scanning photolithographic device comprising linewidth variance as a function of position along a direction of scan;

obtaining a resist response function comprising a change in linewidth as a function of exposure dose for a photosensitive resist;

calculating a corrected exposure dose based upon the signature and the resist response function comprising determining a deviation from a nominal linewidth due to the signature of the scanning photolithographic device and determining a change in exposure dose required from the resist response function to obtain the nominal linewidth after subsequent processing; and varying an exposure dose as a function of position in the direction of scan based on the corrected exposure dose, whereby linewidth variation in the scan direction is reduced.

15. A scanning photolithographic device providing a corrected exposure dose in an illumination slit scanned over a photosensitive substrate comprising:

an illumination source providing electromagnetic radiation in the illumination slit;

a reticle stage, positioned to receive the electromagnetic radiation from said illumination source;

projection optics positioned to receive the electromagnetic radiation from a reticle placed on said reticle stage;

a photosensitive substrate stage positioned to receive the electromagnetic radiation from said projection optics;

a stage control coupled to said reticle stage and said substrate stage, said stage control controlling the movement of said reticle and photosensitive substrate stages providing a scanning exposure of the photosensitive substrate with the illumination slit and having a direction of scan; and a dose control, said dose control modifying an exposure dose of the illumination slit resulting in a predetermined exposure dose of electromagnetic radiation being received by the photosensitive substrate as a function of position along the direction of scan, whereby variations in linewidth in the direction of scan are reduced.

* * * * *